(12) United States Patent
Oikawa

(10) Patent No.: US 6,316,998 B1
(45) Date of Patent: Nov. 13, 2001

(54) DIFFERENTIAL AMPLIFIER AND A METHOD OF COMPENSATION

(75) Inventor: Naoto Oikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/189,865

(22) Filed: Nov. 12, 1998

(30) Foreign Application Priority Data

Nov. 12, 1997 (JP) .................................................... 9-309135

(51) Int. Cl.[7] .................................................... H03F 3/45
(52) U.S. Cl. .................................................... 330/255; 330/257
(58) Field of Search .................................................... 330/253, 255, 330/257, 297

(56) References Cited

U.S. PATENT DOCUMENTS

| | | | | |
|---|---|---|---|---|
| 4,554,515 | * | 11/1985 | Burson et al. | 330/253 |
| 5,179,354 | * | 1/1993 | Okamoto | 330/253 |
| 5,515,003 | * | 5/1996 | Kimura | 330/253 |
| 5,574,401 | * | 11/1996 | Spitalny | 330/253 |
| 5,880,639 | * | 3/1999 | Sakuragi | 330/255 |
| 5,966,050 | * | 10/1999 | Yoshino et al. | 330/255 |

FOREIGN PATENT DOCUMENTS

| | | |
|---|---|---|
| 58-220508 | 12/1983 | (JP) . |
| 64-64350 | 3/1989 | (JP) . |
| 3-80706 | 4/1991 | (JP) . |
| 4-119005 | 4/1992 | (JP) . |
| 4-130807 | 5/1992 | (JP) . |
| 4-243308 | 8/1992 | (JP) . |
| 8-148944 | 6/1996 | (JP) . |

OTHER PUBLICATIONS

Okamoto et al., "A16b Oversampling CODEC With filtering DSP", IEEE International Solid–State Circuits Conference, pp. 74 and 75, (1991).

* cited by examiner

Primary Examiner—Robert Pascal
Assistant Examiner—Khanh Van Nguyen
(74) Attorney, Agent, or Firm—Foley & Lardner

(57) ABSTRACT

In a differential amplifier that is formed by a first differential amplifier formed by a first FET (MP1), to which a first input is applied, and a second FET (MP2), to which a second input is applied, a second differential amplifier formed by a third FET (MP7), to which the first input is applied, and a fourth FET (MP8), to which the second input is applied, in which each load of the first differential amplifier and the second differential amplifier being formed by a current mirror circuit, the signal to be fed to a subsequent stage is extracted from the drain D of the first FET (MP1) or the second FET (MP2).

1 Claim, 3 Drawing Sheets

DIFFERENTIAL AMPLIFIER AND A METHOD OF COMPENSATION

BACKGROUND OF THE INVENTION

1. Field of the Invention

The present invention relates to a differential amplifier and a method of compensation, and more particularly it relates to a differential amplifier that is suitable for use in the pre-amplifier of an audio amplifier.

2. Description of the Related Art

A known fully differential amplifier is as shown in FIG. 2 (for example as in Okamoto, T. et al, "A 16b Oversampling CODEC with filtering DSP", ISSCC Dig. Tech. Papers, pp 74–77, Feb. 1991).

The fully differential amplifier of the past as shown in FIG. 2 is formed by a first MOSFET of a first polarity (MP1), the gate of which is connected to a non-inverting input terminal (103), a second MOSFET of the first polarity (MP2), the gate of which is connected to an inverting input terminal (104) and the source of which is connected to the source of MP1, a third MOSFET of the first polarity (MP3), the source of which is connected to a first power supply (101) and the drain of which is connected to the source of MP1, a fifth MOSFET of the first polarity (MP5), the source of which is connected to the first power supply (101) and the gate of which is connected to the drain of MP5, a sixth MOSFET of the first polarity (MP6), the source of which is connected to the first power supply (101), the gate of which is connected to the gate of MP5, and the drain of which is connected to a non-inverting output terminal (105), a seventh MOSFET of the first polarity (MP7), the gate of which is connected to the non-inverting input terminal (103), an eighth MOSFET of the first polarity (MP8), the gate of which is connected to the inverting input terminal (104) and the source of which is connected to the source of MP7, a ninth MOSFET of the first polarity (MP9), the drain of which is connected to the source of MP7 and the gate of which is connected to the common-mode feedback input terminal (107), an eleventh MOSFET of the first polarity (MP11), the source of which is connected to the first power supply (101) and the gate of which is connected to the drain of MP11, a twelfth MOSFET of the first polarity (MP12), the source of which is connected to the first power supply (101), the gate of which is connected to the gate of MP11, and the drain of which is connected to the non-inverting output terminal (106), a thirteenth MOSFET of the first polarity (MP13), the source of which is connected to the first power supply (101) and the gate and the drain of which is connected to the gate of MP3, a first MOSFET of a second polarity (MN1), the source of which is connected to a second power supply (102), and the gate and drain of which are connected to the drain of MP7, a second MOSFET of the second polarity (MN2), the source of which is connected to the second power supply, the gate of which is connected to the drain of MN1, and the drain of which is connected to the drain of MP2, a third MOSFET of the second polarity (MN3), the source of which is connected to the second power supply (102), the gate of which is connected to the gate and drain of MN1, and the drain of which is connected to the drain of MP5, a sixth MOSFET of the second polarity (MN6), the source of which is connected to the second power supply (102), the gate of which is connected to the drain of MN2, and the drain of which is connected to the drain of MP6, a seventh MOSFET of the second polarity (MN7), the source of which is connected to the second power supply (102), and the gate and the drain of which are connected to the drain of MP8, an eighth MOSFET of the second polarity (MN8), the source of which is connected to the second power supply (102), the gate of which is connected to the gate and the drain of MN7, and the drain of which is connected to the drain of MP1, a ninth MOSFET of the second polarity (MN9), the source of which is connected to the second power supply (102), the gate of which is connected to the gate and the drain of MN7, and the drain of which is connected to the drain of MP11, a twelfth MOSFET of the second polarity (MN12), the source of which is connected to the second power supply (102), the gate of which is connected to the drain of MN8, and the drain of which is connected to the drain of MP12, a thirteenth MOSFET of the second polarity (MN13), the source of which is connected to the second power supply (102), the gate and the drain of which are connected to one end of a constant-current power supply (108), and a fourteenth MOSFET of the second polarity (MN14), the source of which is connected to the second power supply (102), the gate of which is connected to the gate and the drain of MN13, and the drain of which is connected to the drain of MP13. In addition to the above-described MOSFETs, this circuit has a constant-current power supply (108), one end of which is connected to the first power supply (101), and the other end of which is connected to the drain of MN13, a first resistor (R1), one end of which is connected to the gate of MN6, a first capacitor (C1), one end of which is connected to the inverting output terminal (105) and the other end of which is connected to the other end of the first resistor (R1), a second resistor (R2), one end of which is connected to the gate of MN12, a second capacitor (C2), one end of which is connected to the non-inverting output terminal (106) and the other end of which is connected to the other end of the second resistor (R2), a third resistor (R3), one end of which is connected to the gate of MN3, a third capacitor (C3), one end of which is connected to the drain of MP5, and the other end of which is connected to the other end of the third resistor (R3), a fourth resistor (R4), one end of which is connected to the gate of MN7, and a fourth capacitor (C4) one end of which is connected to the drain of MN9, and the other end of which is connected to the other end of the fourth resistor (R4).

The operation of the above-noted fully differential amplifier will be described with reference to FIG. 2. Because this amplifier is a fully differential amplifier, the description will be divided between the inverting output circuit section and the non-inverting output circuit section. First, referring to the inverting output circuit section, the constant-current transistor MP3, the differential input pair MP1, MP2, MP7 and MP2 and the load transistors MN1 and MN2 form a differential input gain stage, the non-inverting output signal of which is transmitted to the gate of MN6 and the inverting output signal of which is transmitted to the gate of MP6 via the inverting signal transmitting circuit formed by MOSFETs MN3 and MP5, thereby forming a two-stage push-pull output amplifier.

The desired phase margin is achieved by addition of the first compensation circuit that is formed by R1 and C1 between the drain of MP2 and the non-inverting output terminal (105), and by addition of the second compensation circuit formed by R3 and C3 between the inverting output of the differential input stage and the output of the inverting signal transmitting circuit. In the same manner with regard to the non-inverting output as well, the constant-current transistor MP3, the differential input pair MP1, MP2, MP8 and MP1 and the load transistors MN7 and MN8 form a differential input gain stage, the non-inverting output signal of which is transmitted to the gate of the MN12, and the inverting output signal of which is transmitted to the gate of MP12 via the inverting signal transmitting circuit formed by MOSFETs MN9 and MP11, thereby forming a two-stage push-pull output amplifier. The desired phase margin is achieved by addition of a compensation circuit that is formed by R2 and C2 between the non-inverting output of the differential input stage and the output of the drive stage, and by addition of a compensation circuit formed by R4 and C4 between the inverting output of the differential input stage and the output of the inverting signal transmitting circuit. And by applying a common mode feedback signal to the gate of MP9, the bias is stabilized.

In the above-noted prior art, however, the following problem exists. If we consider the pole frequencies of a two-stage CMOS amplifier, in view of the small-signal equivalent circuit of FIG. 3, from page 549 of P. R. Gray, and R. G. Meyer "Analysis and Design of Analog Integrated Circuits" Second Edition (published by JHON WILEY & SONS), these can be approximated as follows.

$$P1 = -1/\{(1+gm_2R_2)C_cR_1\} \tag{1}$$

$$P2 = -gm_2C_c/(C_2C_1+C_2C_c+C_cC_1) \tag{2}$$

In the above, P1 is frequency of the first pole, P2 is frequency of the second pole, $gm_2$ is transconductance of the drive stage, $C_c$ is the compensation capacitance, $C_1$ is the internal parasitic capacitance, and $C_2$ is the load capacitance. To achieve phase margin, it is necessary to make P2 high with respect to frequency at which the gain is $1(\omega_1=gm_1/C_c)$. As can be seen, however, from Equation (2), as the internal parasitic capacitance $C_1$ becomes large, P2 becomes small, thereby reducing the phase margin of the two-stage amplifier.

At the inverting output terminal (105) side of the fully differential amplifier that is shown in FIG. 2, the internal parasitic capacitance $C_1$ is chiefly either the sum of the gate capacitances of MN1, MN2, and MN3 and the drain capacitances of MP7, MN1, or the sum of the drain capacitances of MP2 and MN2 and the gate capacitance of MN6, whichever is larger. Normally, the latter is the governing factor and in particular in the case of an operational amplifier that is used in audio applications, because it is necessary, for the purpose of suppressing 1/f noise in the MOS transistors, to make the gate areas of MP1, MP2, MP7, MP8, MN1, MN2, MN7, and MN8 large, $C_1$ becomes large. For this reason, because there was a significant reduction in the phase margin, to alleviate this problem of reduced phase margin, it was necessary to add the second compensation circuit for the inverting signal transmitting circuit, formed by R3 and C3. In the same manner, at the non-inverting output terminal side, it was necessary to add a compensation circuit for the inverting signal transmitting circuit, formed by R4 and C4.

SUMMARY OF THE INVENTION

Accordingly, an object of the present invention is to provide a compact, stable differential amplifier that improves on the above-noted drawbacks in the prior art, this differential amplifier being configured so as to have a reduced parasitic capacitance for stabilized operation, and so as to reduce the surface area occupied by capacitors on the chip, in comparison with the prior art, and a method of compensation of the circuit of the above-noted differential amplifier.

To achieve the above-noted objects, the present invention adopts the following basic technical constitution.

Specifically, in the first aspect of a differential amplifier according to the present invention, a first differential amplifier that is formed by a first FET, to which a first input is applied and a second FET, to which a second input is applied, a second differential amplifier that is formed by a third FET, to which said first input is applied and a fourth FET, to which said second input is applied, in which each load of said first differential amplifier and said second differential amplifier is formed by a current mirror circuit, wherein an output signal fed to a subsequent stage is extracted from the drain of said first FET.

In the second aspect of the present invention, a positive half-cycle output circuit and a negative half-cycle output circuit of a push-pull circuit are connected to the drain of said first FET, and a compensation circuit is connected between an output terminal of said push-pull circuit and said drain of the first FET.

In the third aspect of the present invention, a non-inverting signal transmitting circuit is provided in the above-noted push-pull circuit, this circuit including a current mirror circuit.

The fourth aspect of the present invention is a DC amplifier that is directly coupled from said first differential amplifier up until said push-pull circuit.

The method of compensation according to the present invention is one which, in a first differential amplifier is formed by a first FET, to which a first input is applied and a second FET, to which a second input is applied, and a second differential amplifier is formed by a third FET, to which said first input is applied, and a fourth FET to which said second input is applied, each load of said first differential amplifier and said second differential amplifier is formed by a current mirror circuit, and a push-pull circuit that amplifies an output signal of said differential amplifier, whereby a signal to said push-pull circuit is extracted from a drain of said first FET, and compensation is performed only by a compensation circuit that is provided between said drain of said first FET and the output end of the push-pull circuit.

In particular, a differential amplifier according to the present invention has a first differential amplifier that is formed by a first FET, to which a first input is applied and a second FET, to which a second input is applied, and a second differential amplifier that is formed by a third FET, to which the first input is applied and a fourth FET, to which the second input is applied, the load of the first differential amplifier and the load of the second differential amplifier being formed a current mirror, the configuration of this differential amplifier being made so that the output to the subsequent stage is extracted from the drain of the first FET or the second FET, thereby reducing parasitic capacitance, and the result being the reduction to one compensation capacitor.

Because the number of capacitors taking up space on the chip is reduced, the present invention makes it possible to reduce the size of the chip.

DETAILED DESCRIPTION OF THE PREFERRED EMBODIMENTS

Preferred embodiments of a differential amplifier and a method of compensating the phase of the circuit thereof, according to the present invention, are described in detail below, with references being made to relevant accompanying drawings.

Figure 1:
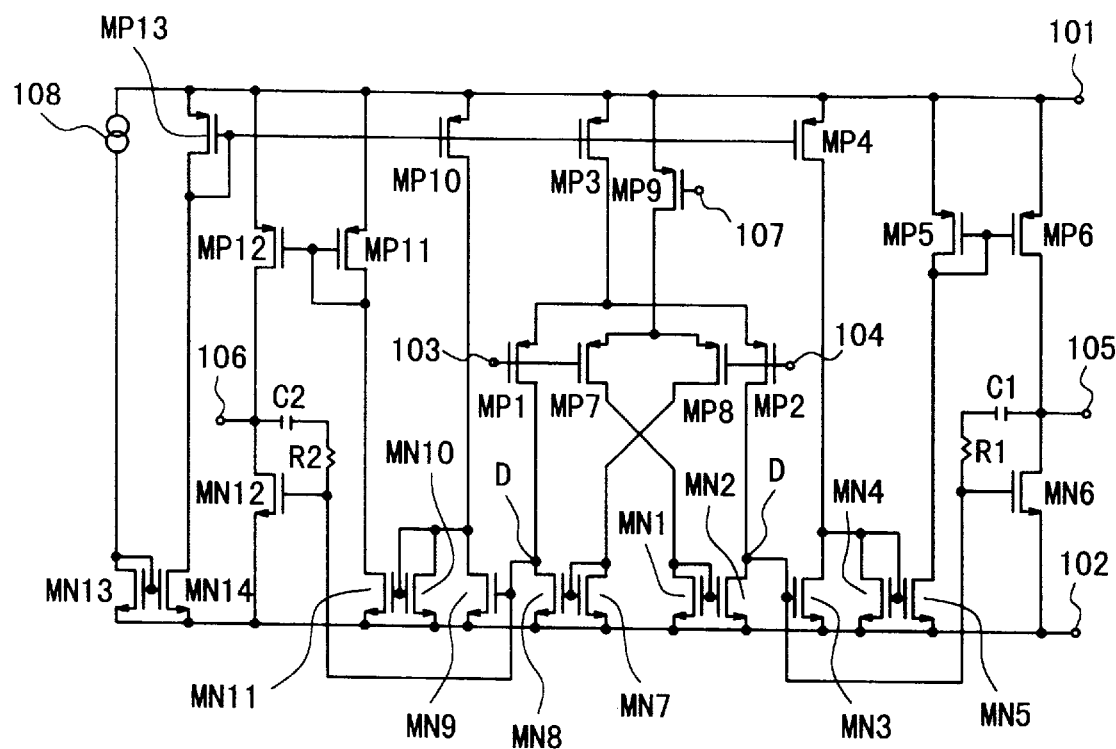
FIG. 1 is a circuit diagram of the present invention.

FIG. 1 is a circuit diagram of the present invention. In the differential amplifier circuit shown in this drawing, a first differential amplifier that is formed by a first FET (MP1), to which a first input is applied and a second FET (MP2), to which a second input is applied, a second differential amplifier that is formed by a third FET (MP7), to which said first input is applied and a fourth FET (MP8), to which said second input is applied, in which each load of said first differential amplifier and said second differential amplifier is formed by a current mirror circuit, wherein an output signal fed to a subsequent stage is extracted from the drain D of said first FET (MP1 or the second FET MP2).

A positive half-cycle output circuit MN12 and a negative half-cycle output circuit MP12 of a push-pull circuit are connected to the drain of MP1, a compensation circuit formed by C2 and R2 being connected between the output terminal (106) of the above-noted push-pull circuit and the drain D of MP1.

Additionally, a non-inverted signal transmitting circuit, formed by transistors MN9, MN10, and MN11 is provided in the above-noted push-pull circuit, this circuit including the current mirror circuit of transistors MN10 and MN11.

The circuit shown is a DC amplifier in which the circuit from the first and second differential amplifier up to the push-pull circuit is directly coupled.

Next the detailed configuration of the above-noted circuit will be described.

An embodiment of a fully differential amplifier according to the present invention is formed by a first MOSFET of a first polarity (p-channel) (MP1), the gate of which is connected to a non-inverting input terminal (103), a second MOSFET of the first polarity (MP2), the gate of which is connected to the inverting input terminal (104) and the source of which is connected to the source of MP1, a third MOSFET of the first polarity (MP3), the source of which is connected to a first power supply (101) and the drain of which is connected to the source of MP1, a fourth MOSFET of the first polarity (MP4), the source of which is connected to the first power supply (101) and the gate of which is connected to the gate of MP3, a fifth MOSFET of the first polarity (MP5), the source of which is connected to the first power supply (101), and the gate of which is connected to the drain of MP5, a sixth MOSFET of the first polarity (MP6), the source of which is connected to the first power supply (101), the gate of which is connected to the drain and the gate of MP5, and the drain of which is connected to the inverting output terminal (105), a seventh MOSFET of the first polarity (MP7), the gate of which is connected to the non-inverting input terminal (103), an eighth MOSFET of the first polarity (MP8), the gate of which is connected to the inverting input terminal (104) and the source of which is connected to the source of MP7, a ninth MOSFET of the first polarity (MP9), the source of which is connected to the first power supply (101), the drain of which is connected to the source of MP7, and the gate of which is connected to a common-mode feedback input terminal (107), a tenth MOSFET of the first polarity (MP10), the source of which is connected to the first power supply (101) and the gate of which is connected to the gate of MP3, an eleventh MOSFET of the first polarity (MP1), the source of which is connected to the first power supply (101), and the gate of which is connected to the drain of MP11, a twelfth MOSFET of the first polarity (MP12), the source of which is connected to the first power supply (101), the gate of which is connected to the gate and the drain of MP11, and the drain of which is connected to the non-inverting output terminal (106), a thirteenth MOSFET of the first polarity (MP13), the source of which is connected to the first power supply (101) and the gate and drain of which are connected to the gate of MP3, the first MOSFET of a second polarity (n-channel) (MN1), the source of which is connected to a second power supply (102) and the gate and drain of which are connected to the drain of MP7, a second MOSFET of the second polarity (MN2), the source of which is connected to the second power supply (102), the gate of which is connected to the gate of the MN1, and the drain of which is connected to the drain of MP2, a third MOSFET of the second polarity (MN3), the source of which is connected to the second power supply (102), the gate of which is connected to the drain of MN2, and the drain of which is connected to the drain of MP4, a fourth MOSFET of the second polarity (MN4), the source of which is connected to the second power supply (102) and the gate and drain of which are connected to the drain of MN3, a fifth MOSFET of the second polarity (MN5), the source of which is connected to the second power supply (102), the gate of which is connected to the drain of MN3, and the drain of which is connected to drain of MP5, a sixth MOSFET of the second polarity (MN6), the source of which is connected to the second power supply (102), the gate of which is connected to the drain of MN2, and the drain of which is connected to the drain of MP6, a seventh MOSFET of the second polarity (MN7), the source of which is connected to the second power supply (102) and the gate and drain of which are connected to the drain of MP8, an eighth MOSFET of the second polarity (MN8), the source of which is connected to the second power supply (102), the gate of which is connected to the gate of MN7, and the drain of which is connected to the drain of MP1, a ninth MOSFET of the second polarity (MN9), the source of which is connected to the second power supply (102), the gate of which is connected to the drain of MN8, and the drain of which is connected to the drain of MP10, a tenth MOSFET of the second polarity (MN10), the source of which is connected to the second power supply (102) and the gate and drain of which are connected to the drain of MN9, an eleventh MOSFET of the second polarity (MN11), the source of which is connected to the second power supply (102), the gate of which is connected to the drain of MN9, and the drain of which is connected to the drain of MP11, a twelfth MOSFET of the second polarity (MN12), the source of which is connected to the second power supply (102), the gate of which is connected to the drain of MN8, and the drain of which is connected to the drain of MP12, a thirteenth MOSFET of the second polarity (MN13), the gate and drain of which are connected to one end of a constant-current power supply (108), and the source of which is connected to the second power supply (102), and a fourteenth MOSFET of the second polarity (MN14), the source of which is connected to the second power supply (102), the gate of which is connected to the drain of MN13, and the drain of which is connected to the drain of MP13, and a constant-current power supply (108), one end of which is connected to the drain of MN13, the other end of which is connected to the first power supply (101). In addition, this circuit has a first resistor (R1), one end of which is connected to the gate of MN6, a first capacitor (C1), one end of which is connected to the non-inverting output terminal (105) and the other end of which is connected to other end of the first resistor (R1), a second resistor (R2), one end of which is connected to the gate of MN12, and a second capacitor (C2), one end of which is connected to the non-inverting output terminal (106) and the other end of which is connected to the other end of the second resistor (R2).

The transistors MN1 and MN2, MN4 and MN5, MN7 and MN8, MN10 and MN11, MN13 and MN14, MP3, MP4, MP10 and MP13, MP5 and MP6, and MP11 and MP12 each form current mirror circuits respectively.

Next, the operation of the circuit of FIG. 1 will be described, with reference to the drawing.

Because this amplifier is a fully differential amplifier, the description will be divided between the inverting output circuit section and the non-inverting output circuit section.

First, referring to the inverting output circuit section, the constant-current transistor MP3, the differential input pair MP1, MP2, MP7 and MP2 and the load transistors MN1 and MN2 form a differential input gain stage, the non-inverting output signal of which is transmitted to the gate of MN6 and the inverting output signal of which is transmitted to the gate of MP6 via the signal transmitting circuit formed by MOS-FETs MN3, MN4, MN5, MP4, and MP5, thereby forming a two-stage push-pull output amplifier. In order to achieve the desired phase margin, a compensation circuit formed by the series circuit of resistor R1 and capacitor C1 is connected between the output of the differential input gain stage and the drain of MN6.

In the circuit of the present invention, in contrast to the prior art, the gates of transistors MN1 and MN2 are not connected to other transistors, the total parasitic capacitance seen from the drain of transistor MN2 being small, the result being that, in accordance with Equation (2), the pole frequency is shifted into the high-frequency region, thereby increasing the phase margin.

For this reason, the series circuit of the resistor R1 and the capacitor C1 provided between the drain D of transistor MN2 and the inverting output terminal (105) is capable of performing compensation of the differential amplifier of the present invention.

In the same manner with regard to the non-inverting output circuit section as well, the constant-current transistor MP3, the differential input pair MP1, MP2, MP8 and MP1 and the load transistors MN7 and MN8 form a differential input gain stage, the non-inverting output of which is transmitted to the gate of the transistor MN12 and to the gate of MP12 via the non-inverting signal transmitting circuit formed by MN9, MN10, MN11, MP10, and MP11, thereby implementing a two-stage push-pull output amplifier. The desired phase margin is achieved by the series circuit of the resistor R2 and the capacitor C2 between the output of the differential input gain stage and the output of the drive stage. The bias is stabilized by inputting a common-mode feedback signal to the gate of MP9.

In this manner, in a differential amplifier according to the present invention, the signal fed to the latter-stage push-pull circuit of MP6 and MN6 is extracted from the drain D of either the FET MP1 or the FET MP7, and the compensation circuit formed by the series connected resistor R1 and capacitor C1 is provided between the above-noted drain D and the output terminal (105) of the push-pull circuit, thereby performing compensation.

Figure 2:
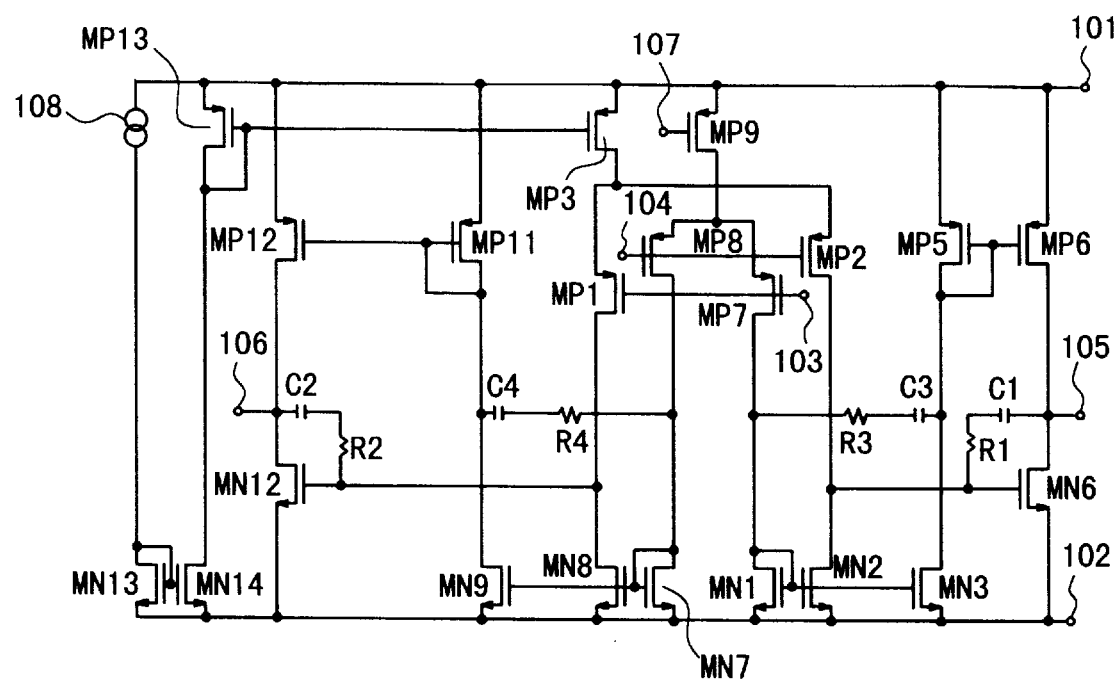
FIG. 2 is a circuit diagram of the prior art.
Figure 3:
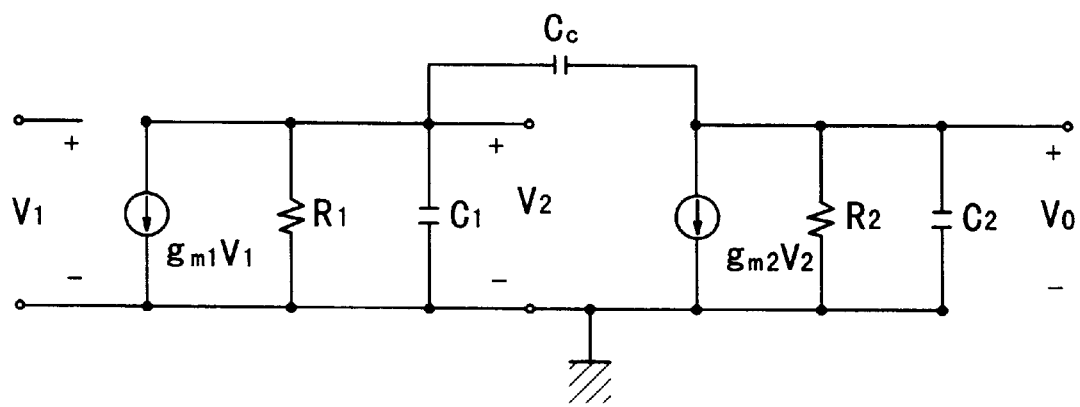
FIG. 3 is an equivalent circuit of the prior art shown in FIG. 2.

In the fully differential amplifier of the past as shown in FIG. 2, the internal parasitic capacitance C1 of Equation (2) is chiefly the sum of the gate capacitances of MN1, MN2, and MN3 and the drain capacitances of MP7 and MN1, or the sum of the drain capacitances of MP2 and MN2 and the gate capacitance of MN6, whichever is larger, the former normally being dominant. In contrast to this, in the present invention, because the gate capacitance of the transistor MN3 is not included in the parasitic capacitance C1, there is a commensurate improvement in the phase margin, making it possible to eliminate the compensation circuit for the inverting signal transmitting circuit, which had been desired in the prior art.

What is claimed is:

1. A fully differential amplifier having push-pull outputs and an input stage which comprises:

a first differential amplifier pair including a first FET to which a first input is applied and a second FET to which a second input is applied;

a second differential amplifier pair including a third FET, to which the first input is applied and a fourth FET, to which the second input is applied;

a first current mirror circuit including a fifth FET and a sixth FET each serving as loads of said first FET and said fourth FET, respectively; and a second current mirror circuit including a seventh FET and an eighth FET each serving as loads of said second FET and said third FET, respectively, wherein a first output of said input stage is connected to a first push-pull amplifier, and a second output of said input stage is connected to a second push-pull amplifier, wherein said fully differential amplifier is configured such that the first output of said input stage is taken out from a drain of one of the FETs forming said first current mirror circuit and a gate and a drain of said one of the FETs forming said first current mirror circuit are not connected to each other, and simultaneously therewith, the second output of said input stage is taken out from a drain of one of the FETs forming said second current mirror circuit and a gate and a drain of said one of the FETs forming said second current mirror circuit are not connected to each other, wherein a first phase compensation circuit is provided between said drain of said one of the FETs forming said first current mirror circuit and an output of said first push-pull amplifier, and a second phase compensation circuit is provided between said drain of said one of the FETs forming said second current mirror circuit and an output of said second push-pull amplifier, and wherein, between said output of said first push-pull amplifier and said drain of said one of the FETs forming said first current mirror circuit, are provided:

a ninth FET, a gate of which is connected to said drain of said one of the FETs forming said first current mirror circuit, a drain of which is connected to said output of said first push-pull amplifier, and a source of which is connected to a first power source;

a tenth FET, a source of which is connected to a second power source and a drain of which is connected to the output of said first push-pull amplifier;

an eleventh FET, a gate and a drain of which are connected to each other and forming a third current mirror circuit with said tenth FET;

a twelfth FET, a source of which is connected to said first power source and a drain of which is connected to a drain of said eleventh FET so as to drive said eleventh FET;

a thirteenth FET, a gate and a drain of which are connected to a gate of said twelfth FET and a drain of which is connected to one end of a first constant current source, and forming a fourth current mirror circuit with said twelfth FET;

a fourteenth FET, a gate of which connected to said drain of said one of the FETs forming said first current mirror circuit, a source of which is connected to said first power source, and a drain of which is connected to said first constant current source, and wherein, between said output of said second first push-pull amplifier and said drain of said one of the FETs forming said second current mirror circuit, are provided;

a fifteenth FET, a gate of which is connected to said drain of said one of the FETs forming said second current mirror circuit, a drain of which is connected to said output of said second push-pull amplifier, and a source of which is connected to the first power source;

a sixteenth FET, a source of which is connected to said second power source and a drain of which is connected to the output of said second push-pull amplifier;

a seventeenth FET, a gate and drain of which are connected to each other and forming a fifth current mirror circuit with said sixteenth FET;

an eighteenth FET, a source of which is connected to said first power source and a drain of which is connected to a drain of said seventeenth FET so as to drive said seventeenth FET;

a nineteenth FET, a gate and a drain of which are connected to a gate of said eighteenth FET and a drain of which is connected to one end of a second constant current source, and forming a sixth current mirror circuit with said eighteenth FET; and a twentieth FET, a gate of which is connected to said drain of said one of the FETs forming said second current mirror circuit, a source of which is connected to said first power source, and a drain of which connected to said drain of said nineteenth FET.

* * * * *